(12) United States Patent
Banerjee et al.

(10) Patent No.: US 10,811,160 B2
(45) Date of Patent: Oct. 20, 2020

(54) METHOD OF PRODUCING THERMOELECTRIC MATERIAL

(75) Inventors: Debasish Banerjee, Ann Arbor, MI (US); Minjuan Zhang, Ann Arbor, MI (US); Takuji Kita, Susono (JP)

(73) Assignee: TOYOTA MOTOR ENGINEERING & MANUFACTURING NORTH AMERICA, INC., Plano, TX (US)

(*) Notice: Subject to any disclaimer, the term of this patent is extended or adjusted under 35 U.S.C. 154(b) by 1274 days.

(21) Appl. No.: 13/117,286

(22) Filed: May 27, 2011

(65) Prior Publication Data
US 2012/0298924 A1    Nov. 29, 2012

(51) Int. Cl.
| | |
|---|---|
| H01L 35/34 | (2006.01) |
| H01B 1/02 | (2006.01) |
| B82Y 40/00 | (2011.01) |
| H01L 35/26 | (2006.01) |

(52) U.S. Cl.
CPC ............... H01B 1/02 (2013.01); B82Y 40/00 (2013.01); H01L 35/26 (2013.01); H01L 35/34 (2013.01)

(58) Field of Classification Search
USPC ................................................ 136/200–242
See application file for complete search history.

(56) References Cited

U.S. PATENT DOCUMENTS

| | | | |
|---|---|---|---|
| 7,195,721 B2 | 3/2007 | Gurin | |
| 7,734,428 B2* | 6/2010 | Banerjee et al. | 702/30 |
| 2010/0171546 A1 | 7/2010 | Kwok et al. | |
| 2011/0143489 A1* | 6/2011 | Korevaar | 438/84 |

FOREIGN PATENT DOCUMENTS

| | | | | |
|---|---|---|---|---|
| EP | 1187230 A2 | | 3/2002 | |
| JP | 2002076452 A | | 3/2002 | |
| WO | WO 2010/041146 | * | 4/2010 | H01L 35/16 |

OTHER PUBLICATIONS

Popescu et al., Model of transport properties of thermoelectric nanocomposite materials, Physical Review B 79 (2009).
Moyzhes et al, Thermoelectric figure of merit of metal-semiconductor barrier structure based on energy relaxation length, Applied Physics Letters, vol. 73, No. 13, Sep. 28, 1998.

* cited by examiner

*Primary Examiner* — Thanh Truc Trinh
(74) *Attorney, Agent, or Firm* — Dinsmore & Shohl LLP (57) ABSTRACT

A process for manufacturing a thermoelectric material having a plurality of grains and grain boundaries. The process includes determining a material composition to be investigated for the thermoelectric material and then determining a range of values of grain size and/or grain boundary barrier height obtainable for the material composition using current state of the art manufacturing techniques. Thereafter, a range of figure of merit values for the material composition is determined as a function of the range of values of grain size and/or grain boundary barrier height. And finally, a thermoelectric material having the determined material composition and an average grain size and grain boundary barrier height corresponding to the maximum range of figure of merit values is manufactured.

7 Claims, 5 Drawing Sheets

METHOD OF PRODUCING THERMOELECTRIC MATERIAL

FIELD OF THE INVENTION

This invention relates to materials having thermoelectric properties and to thermoelectric devices.

BACKGROUND OF THE INVENTION

A thermoelectric device can be used to obtain electrical energy from a thermal gradient (for example, a thermoelectric generator using the Seebeck effect), or to generate a thermal gradient from electrical energy (for example, a thermoelectric refrigerator using the Peltier effect). The discussion below is directed to the Seebeck effect, but the general concepts also apply to applications of the Peltier effect.

A typical thermoelectric device is built up from several unicouples, which are typically pairs of thermally conductive p-type (P) and n-type (N) semiconductors. These unicouples are connected electrically in series and thermally in parallel. Theoretically, the maximum efficiency of the conversion of heat energy to electrical energy is given by:

$$\zeta_{max} = \frac{(T_H - T_C)}{T_H} \frac{\sqrt{1 + ZT_{ave}} - 1}{\sqrt{1 + ZT_{ave}} + T_C/T_H}$$

where $T_{ave}=(T_H+T_C)/2$ is the average temperature of thermal gradient having a hot temperature (Ta) end and a cold temperature ($T_C$) end, and Z is a figure of merit, defined as $Z=S^2\sigma/\kappa$. The figure of merit Z depends on the macroscopic transport parameters of the materials, namely the Seebeck coefficient (S), electrical conductivity ($\sigma$), and thermal conductivity ($\kappa$). A large figure of merit is provided by a thermoelectric material having a large Seebeck coefficient, high electrical conductivity, and low thermal conductivity.

The Seebeck coefficient is further defined as the ratio of the open-circuit voltage to the temperature difference between the hot and cold junctions of a circuit exhibiting the Seebeck effect, or $S=V/(T_H-T_C)$. Since Z varies with temperature, a useful dimensionless figure of merit can be defined as ZT.

By the end of the 1950s, the best bulk thermoelectric materials were found to be alloys of bismuth telluride and antimony, which gave a room temperature ZT~1. Workers in the thermoelectric field have been attempting to improve the figure of merit over the past 40 years without much success. Increasing ZT is difficult because the three parameters S, $\sigma$, and k are all related to the free carrier concentration and are usually not independent. For example, doping typically increases the semiconductor's electrical conductivity, but decreases its Seebeck coefficient and increases the thermal conductivity. Efforts to reduce the lattice thermal conductivity by alloying also reduce the electrical conductivity by providing an extra scattering mechanism.

Dresselhaus and coworkers at MIT theoretically demonstrated that quantum confinement of electrons and phonons within nanowires of a thermoelectric material can increase the value of ZT. 1-D nanowires in particular could reach ZT≈2-5 if the nanowire diameter lies in the range of 5-10 nanometers. Certain structures have been investigated, for example such as described in Heremans, J. P. et al., "Thermoelectric Power of Bismuth Nanocomposites"; Phys. Rev. Lett.; 2002, 88, 216801; Venkatasubramanian, R. et al., "Thin-film thermoelectric devices with high room temperature figures of merit"; Nature; 2001, 413, 597-602; Harman, T. C. et al., "Thermoelectric quantum dot superlattices with high ZT"; Electron. Mater.; 2000, 29, L1-L4; Rabin, O. et al., "Anomalously high thermoelectric figure of merit in $Bi_{1-x}Sb_x$ nanowires by carrier pocket alignment"; APL; 2001, 79, 81-83; and Dresselhaus, M. S. et al., "Low-dimensional thermoelectric materials"; PSS; 1999, 41, 679-682. However, these approaches do not provide a simple approach to making large-scale, low-cost thermoelectric devices. Conventional semiconductor device fabrication methods are unsuitable for manufacturing bulk samples, and are often expensive.

In automobiles, about 70 percent of energy derived from fuel is lost to waste heat and engine cooling. Only a small proportion of energy provided by fuel combustion is used, and a large amount of thermal energy is thrown away, Recovery of waste thermal energy is a big challenge in automotive industries due to the increasing energy crisis. Thermoelectric conversion of thermal energy to electrical energy could be an effective way to obtain electrical energy from otherwise wasted heat production. However, direct thermal to electric conversion (DTEC) technology currently faces two major challenges: low conversion efficiency and insufficient power density. Hence, improved materials and devices having high thermoelectric conversion efficiency are urgently required.

In response to the need for high thermoelectric conversion efficiency materials, Zhang et al. have investigated thermoelectric materials comprising two or more components, at least one of which is a thermoelectric material (U.S. Pat. No. 7,309,830). However, a given thermoelectric material system can have a wide range of compositions that may, or may not, exhibit high ZT values, and as such, Banerjee et al, have developed a process for determining an optimum range of compositions for a nanocomposite thermoelectric material system (U.S. Pat. No. 7,734,428).

In addition to the above, other factors such as grain size and grain boundary properties have been postulated to affect the properties of thermoelectric materials. However, as of yet no process has been developed to determine if there is and/or which optimum range of such factors can provide a thermolectric material with an improved ZT. Therefore, a process to model, calculate and/or determine an optimum range of grain related properties in which a thermoelectric material exhibits high ZT values would be desirable.

SUMMARY OF THE INVENTION

A process for manufacturing a thermoelectric material having a plurality of grains and grain boundaries is provided. The process includes determining a material composition to be investigated for the thermoelectric material and then determining a range of values of grain size and/or grain boundary barrier height obtainable for the material composition using current state of the art manufacturing techniques. Thereafter, a plurality of Seebeck coefficients for the material composition as a function of the range of values for the grain size and/or grain boundary barrier height are calculated. In addition, a plurality of electrical resistivity values and a plurality of thermal conductivity values for the material composition and as a function of the range of values for the grain size and/or grain boundary barrier height are calculated.

Once such plurality of values have been determined, a range of figure of merit values for the material composition as a function of the calculated Seebeck coefficients, calculated electrical resistivity values, and calculated thermal conductivity values are determined/calculated. Based on the range of figure of merit values, a generally maximum range thereof for the material composition is determined, a thermoelectric material having the determined material composition and an average grain size and grain boundary barrier height corresponding to the maximum range of figure of merit values is manufactured.

The material composition of the thermoelectric material can be a bulk thermoelectric material composition, or in the alternative, a nanocomposite thermoelectric material composition. The range of values of grain size can be between 5 and 100 nanometers while the range of values of grain boundary barrier height can be between 10 and 300 millielectron volts. In addition, the grain size of the manufactured thermoelectric material can be obtained by consolidating a plurality of nanoparticles having a mean diameter generally equal to less than the grain size and the grain boundary barrier height can be obtained by doping of the thermoelectric material, altering a surface of a plurality of nanoparticles used to manufacture the thermoelectric material, and the like.

DETAILED DESCRIPTION OF THE INVENTION

The present invention discloses a process for determining an optimum range of compositions for a thermoelectric material system, within which the material system may exhibit generally high figure of merit values. As such, the process has utility for improving the efficiency of experimental design and production of thermoelectric materials.

The process for determining an optimum range of compositions for a thermoelectric material system considers a variety of relevant factors, parameters and the like in order to determine which material systems should be considered and/or which range of compositions should be studied in more detail. A thermoelectric material exhibiting a dimensionless high figure of merit (ZT) needs to possess a high Seebeck coefficient (S) for high voltage generation, a low electrical resistivity (ρ) to minimize Ohmic losses and a low thermal conductivity (k) to minimize heat conduction.

The relationship between ZT, S, ρ, and k can be expressed as:

$$ZT = S^2 T/k\rho \qquad \text{Eqn 1}$$

and/or as:

$$ZT = \frac{S^2 T}{\rho(k_{el} + k_{ph})} \qquad \text{Eqn 2}$$

where $k_{el}$ and $k_{ph}$ are the electronic and phonon contribution to the overall thermal conductivity k.

Typically, S, ρ, and k are interdependent with an increase of the Seebeck coefficient resulting in an increase in electrical resistivity, whereas a decrease in the electrical resistivity results in an increase of the thermal conductivity. At least one approach for obtaining high figure of merit values has investigated the insertion of nanoparticles within a thermoelectric material (U.S. Pat. No. 7,309,830). Materials using this approach can result in phonons being scattered by the nanoparticles, thereby reducing the lattice thermal conductivity while leaving the electrical resistivity and Seebeck coefficient for the thermoelectric host matrix unchanged.

Elemental substitutions, also known as atomic substitutions, in potential thermoelectric materials have imperfections on the order of 1 angstrom (Å). Thus alloying additions can result in the scattering of short-wavelength phonons much more effectively than mid- and long-wavelength phonons. Therefore, mid- and long-wavelength phonons dominate the heat conduction in alloys and thermoelectric materials that have been doped with other elements not originally within the starting material. In the alternative, the inclusion of additions such as nanoparticles in the size range of phonon wavelengths introduces another scattering mechanism that affects mid- and/or long-wavelength phonons, thereby providing an opportunity to reduce the thermal conductivity of such materials below the alloy limit. However, which nanoparticles with respect to their composition, size and size distribution, and which host matrix the nanoparticles should be added to has heretofore been a difficult task to predict. In response to the difficulty in predicting successful thermoelectric material systems, a process to perform just this task has been developed by Banerjee et al. (U.S. Pat. No. 7,734,428).

An embodiment of the current process includes determining a material composition to be investigated for the thermoelectric material and determining a range of values for a grain related property that is obtainable for the material composition using state of the art manufacturing techniques. Once the material composition and the range of values for the grain related property have been determined, a plurality of Seebeck coefficients for the material composition as a function of the range of values can be calculated. In addition, a plurality of electrical resistivity values and a plurality of thermal conductivity values for the material composition as a function of the range of values for the grain related property can also be calculated.

It is appreciated that once the plurality of Seebeck coefficients, electrical resistivity values, and thermal conductivity values have been determined, a range of figure of merit values as a function thereof can be calculated and a generally maximum range of figure of merit values can be determined, such values being a function of the range of values of the grain related property. Naturally, once the maximum range of figure of merit values has been determined, a thermoelectric material having the determined material composition and the grain related property(ies) corresponding to the maximum range of figure of merit values is manufactured.

In the alternative to the above outlined embodiment, a plurality of material compositions can be investigated in this manner and a single material composition or a limited range of compositions having a potential and desired ZT are manufactured.

The grain related property can include any grain related property known to those skilled in the art, illustratively including grain size, grain boundary bather height, and the like. For the purposes of the present invention, the term "grain size" is defined as the average mean diameter of grains within a thermoelectric material obtained through any method and/or technique known to those skilled in the art. For example and for illustrative purposes only, a grain size can be determined by taking a statistical average of a plurality of grain diameters from a metallographic cross-section of the material with a single grain diameter obtained by averaging at least two linear and orthogonal measurements across a given grain.

Also for the purposes of the present invention, the term "grain boundary barrier height" is defined as the energy potential of a grain boundary that will scatter an electron having less energy than the potential and allow an electron having more energy than the potential to pass therethrough.

The material composition to be investigated can be a bulk thermoelectric material composition, or in the alternative, a nanocomposite thermoelectric material composition. It is appreciated that the term "bulk thermoelectric material" refers to a polycrystalline material without the presence of second phase particles such as nanoparticles of an insulating type material. In the alternative, the term "nanocomposite thermoelectric material" refers to a bulk thermoelectric material having second phase particles such as nanoparticle insulating material inclusions, e.g. nanoparticle inclusions such as silicon oxide, zinc oxide, and the like.

The range of values for grain size of the material composition to be investigated can be between 5 and 100 nanometers (nm) while the range of values of grain boundary barrier height can be between 10 and 300 milli-electron volts (meV). In addition, the grain size of the manufactured thermoelectric material can be obtained by consolidating a plurality of nanoparticles having a mean diameter that is less than or generally equal to the final grain size of the material. The grain boundary barrier height of the manufactured thermoelectric material can be altered and/or obtained by doping of the material and/or altering a surface of the plurality of nanoparticles used to manufacture the thermoelectric material. In some instances, the surface of the plurality of nanoparticles is altered by applying a coating thereon before the nanoparticles are consolidated to produce the thermoelectric material.

Not being bound by theory, it is appreciated that a grain boundary is a result of and/or forms from a crystallographic misalignment between adjacent grains. In addition, the misalignment results in a residual electric charge across the grain boundary which can produce an electrostatic potential commonly referred to as an interfacial barrier and/or grain boundary barrier height which can be measured using AC impedance. As a first approximation, the magnitude of this interfacial barrier, also known as the grain boundary barrier height, can be calculated from the expression:

$$E_b = \frac{eN_t^2}{8\varepsilon N_D} \quad \text{Eqn 3}$$

where $N_t$ is the number density of traps, $\varepsilon$ is the permittivity and $N_D$ is the doping concentration. The trap density is generally unkown and can vary widely, however assuming a generally high doping level and reported values for $N_t$ in the range of $10^{-11}$-$10^{-3}$ cm$^{-3}$, an $E_b$ of around 25 meV can be calculated.

The process can provide a thermoelectric material as schematically illustrated in FIGS. 1$a$ and 1$d$. In particular, FIG. 1$b$ illustrates a bulk thermoelectric material 100' having altered and/or engineered grain boundaries 110' when compared to the grain boundaries 110 of the material 100 illustrated in FIG. 1$a$. In addition, FIG. 1$d$ illustrates a nanocomposite thermoelectric material 200' having altered and/or engineered grain boundaries 210' in addition to nanoparticle inclusions 205 when compared to the material 200 having the nanoparticles 205 and grain boundaries 210.

The grain size of the thermoelectric material 100 and/or 200 can be altered and/or engineered, e.g. by using nanoparticles with a desired average size to consolidate and manufacture the material. In addition, local electronic and thermal properties of the grain boundaries can be altered and/or engineered by controlling the interfacial composition between the grains, that is the interfacial composition of the grain boundaries. For example and for illustrative purposes only, a second phase can be engineered to be present at the interface between the grains such as $Pb_{0.75}Sn_{0.25}Se$ coatings on $Pb_{0.75}Sn_{0.25}Te$; $CoSb_3$ coatings on $La_{0.9}CoFe_3Sb_{12}$; and alkali-metal salt coatings on $(Bi_{0.2}Sb_{0.8})_2Te_3$. In fact, results from $CoSb_3/La_{0.9}CoFe_3Sb_{12}$ and coated $(Bi_{0.2}Sb_{0.8})_2Te_3$ materials have shown moderate improvements in the figure of merit ranging from 15-30%.

In order to incorporate a grain related property into a modeling and/or manufacturing process, the scattering behavior of electrons, holes and/or phonons within a material can be useful. Not being bound by theory, a theoretical simulation can be based on the Boltzmann equation with relaxation time approximation. For example, a modified Callaway model with respect to the lattice of a thermoelectric material can be incorporated with scattering of phonons through grain boundaries, defects, nanoparticles, and the like provided by Equation 4 below:

$$\tau_c^{-1} = \tau_B^{-1} + \tau_U^{-1} + \tau_N^{-1} + \tau_A^{-1} + \tau_D^{-1} \quad \text{Eqn4}$$

where $\tau$ corresponds to scattering time and the subscripts B, U, N, A and D correspond to boundary, Umplclamp, normal, alloy, and nanoparticle, respectively, related scattering.

With respect to carriers, that is electrons and holes, Equation 5 can be used where Op, DOp, and DAp represent optical phonon, deformation potential of optical phonon, and deformation potential of acoustic phonon related scattering.

$$\tau_\xi^{-1} = \tau_{Op}^{-1} + \tau_{DOp}^{-1} + \tau_{DAp}^{-1} \quad \text{Eqn5}$$

In addition to scattering time, the total electrical conductivity can be expressed as a summation of the contributions from both electron and hole bands, while the overall Seebeck coefficient can be obtained through weighting each band's contribution using a normalized electrical conductivity. In order to obtain the electronic thermal conductivity, the electronic thermal conductivity from the Lorentz number (L) can be obtained using Equations 6-8 below. In particular, Equation 6 is an expression of the total electrical conductivity ($\sigma$), Equation 7 is an expression of the overall Seebeck coefficient, and Equation 8 is an expression for the electronic thermal conductivity. It is appreciated that the bipolar thermal conductivity contribution to the electronic thermal conductivity must also be considered and that this type of conduction occurs when carriers moving between different bands carry heat via the Peltier effect and as such can still transport heat even if the net electric current is zero.

$$\sigma = \sum_i^{e,h} \sigma_i \qquad \text{Eqn 6}$$

$$S = \sum_i^{e,h} \frac{S_i \sigma_i}{\sigma} \qquad \text{Eqn 7}$$

$$k_e = \left(\frac{k_B}{e}\right)^2 \left(\sum_i^{e,h} L_i + L_b\right)\sigma T \qquad \text{Eqn 8}$$

Figure 1A:
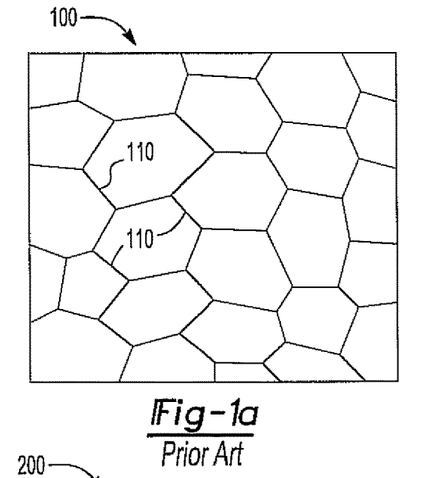
FIGS. 1a-1d are schematic illustrations of: (a) the grain structure of a prior art thermoelectric material; (b) a schematic illustration of a thermoelectric material having altered grain boundaries according to an embodiment of the present invention; (d) a schematic illustration of a prior art nanocomposite thermoelectric material; and (d) a schematic illustration of a nanocomposite thermoelectric material having modified grain boundaries according to an embodiment of the present invention.
Figure 1B:
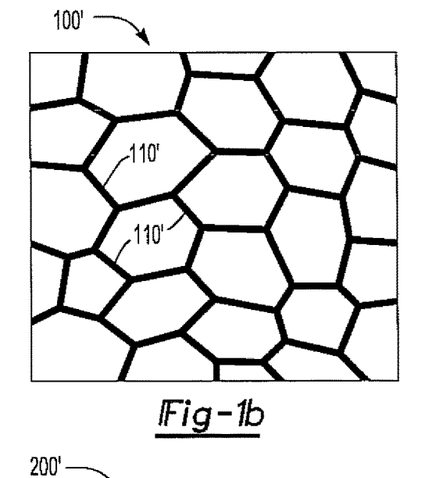
Figure 1C:
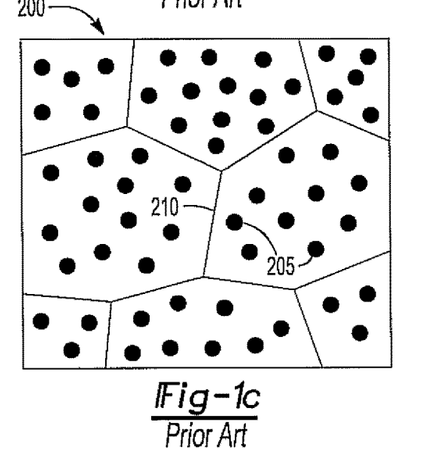
Figure 1D:
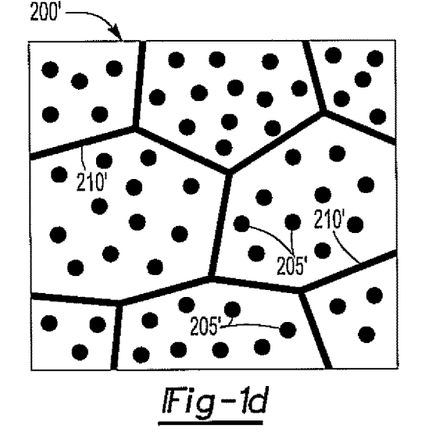
Figure 2:
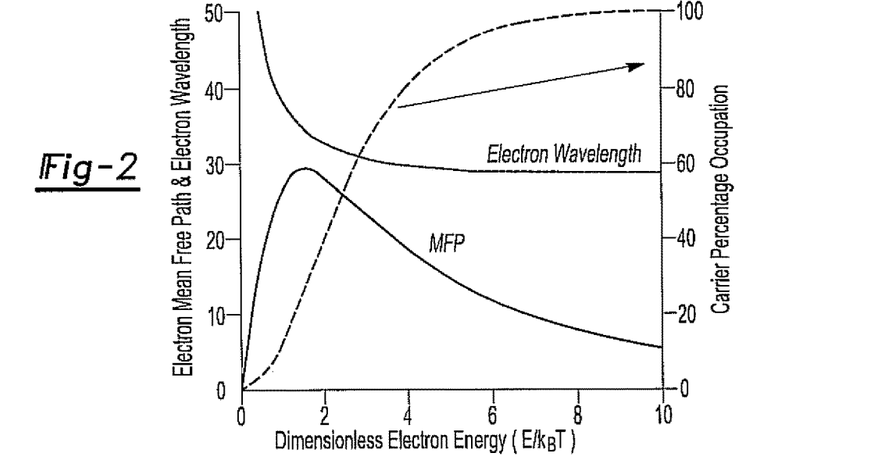
FIG. 2 is a graph illustrating calculated electron mean free path, electron wavelength, and carrier percentage occupation as a function of dimensionless electron energy.

In addition to the above, the nature of grain boundary scattering exhibited by carriers can be estimated from the electron wavelength and electron mean free path (MFP) and the cumulative distribution function of the electron occupation number versus electron energy can provide the percentage of electrons that have energy less than a certain value. In particular, Equations 9-13 afford for the electron MFP, electron wavelength, and carrier percentage occupation as a function of dimensionless electron energy shown in FIG. 2 where the electron MFP can be calculated using the expression $l=v\tau$ where $v$ and $\tau$ are provided by Equations 11 and 4, respectively, g is the density of state function and $\alpha$ is equal to the inverse of the bandgap for the material ($1/E_g$), in some instances referred to as the parabolicity factor.

$$g = \frac{\int_0^{E/k_h T} g(E)dE}{\int_0^{\infty} g(E)dE} \qquad \text{Eqn 9}$$

$$g(E) = v^2 D(E)\left(-\frac{\partial f}{\partial E}\right) \qquad \text{Eqn 10}$$

$$v = \frac{(2E(1+\alpha E)/m_c^*)^{0.5}}{(1+2\alpha E)} \qquad \text{Eqn 11}$$

$$D(E) = \frac{\sqrt{2}(m_d^*)^{1.5}}{\pi^2 \hbar^3} E(1+2\alpha E)(1+\alpha E) \qquad \text{Eqn 12}$$

$$\lambda = \frac{2\pi\hbar}{m_c^* v} = \frac{2\pi\hbar(1+2\alpha E)}{\sqrt{2m_c^* E(1+\alpha E)}} \qquad \text{Eqn 13}$$

As shown in FIG. 2, the majority of electrons have a MFP less than 30 nanometers which is comparable and/or of the same order of magnitude of a grain size of between 20 to a few hundred nanometers. As such, FIG. 2 confirms that a majority of carriers will experience multiple scattering due to the grain boundaries and "memory" of a previous collision by a carrier will be retained by the carrier when it reaches another portion of the grain interface, i.e. each scattering point on a grain boundary is not independent from others. In addition, since the dominant electron wavelength is approximately 28 nm and an assumed grain boundary width of 1 to 2 nm is much smaller, there is no possibility of diffuse scattering of electrons. Finally, the electron MFP of less than 30 nanometers is comparable to a hole wavelength of 28 nm which implies that the Boltzmann equation is at the edge of its validity using this process. As such, it is appreciated that other expressions with respect to relaxation time approximation can be used for the basis of a theoretical simulation that incorporates grain boundary effect in determining various properties of a thermoelectric material and still fall within the scope of the present invention.

Figure 3:
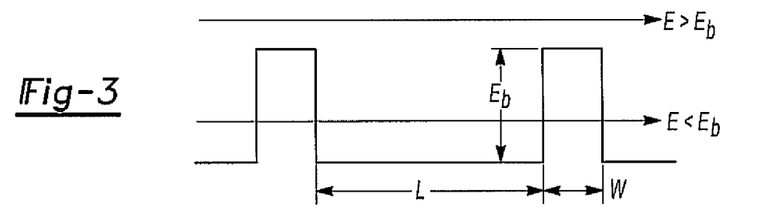
FIG. 3 is a schematic illustration of a model for treatment of grain boundary barrier height according to an embodiment of the present invention.

Turning now to the actual effect of grain boundary properties on thermoelectric characteristics, FIG. 3 provides a model of a grain having a grain boundary with a width w and a grain boundary potential barrier of $E_b$. In addition, the grain size has a dimension of L which naturally separates the grain boundary on opposing sides of the grain. As illustrated in the figure, if an electron has an energy of E, the electron will pass through the grain boundary barrier height if $E>E_b$ and will scatter if $E<E_b$.

Not being bound by theory, assuming T(E) is a transmission probability of an electron passing through a grain boundary barrier height and there are N grain boundaries, the MFP of the electron due to scattering by the grain boundary can be expressed as Equation 14 when N is assumed to be infinity.

$$\lambda_{grainboundary} = \sum_{n=1}^{N\to\infty} T(E)^n(1-T(E))nL = \frac{T(E)L}{1-T(E)} \qquad \text{Eqn 14}$$

which further provides a relaxation time of:

$$\tau_B = \lambda_{grainboundary}/v \qquad \text{Eqn 15}$$

where v is given by:

$$\tau_B = \frac{L}{v}\left(1 + \frac{4\frac{E}{E_b}\left|1-\frac{E}{E_B}\right|}{\sinh^2\left|\sqrt{\frac{2m_c^* E_B w^2}{\hbar^2}}\left|1-\frac{E}{E_B}\right|\right|}\right) \qquad \text{Eqn 16}$$

Figure 4:
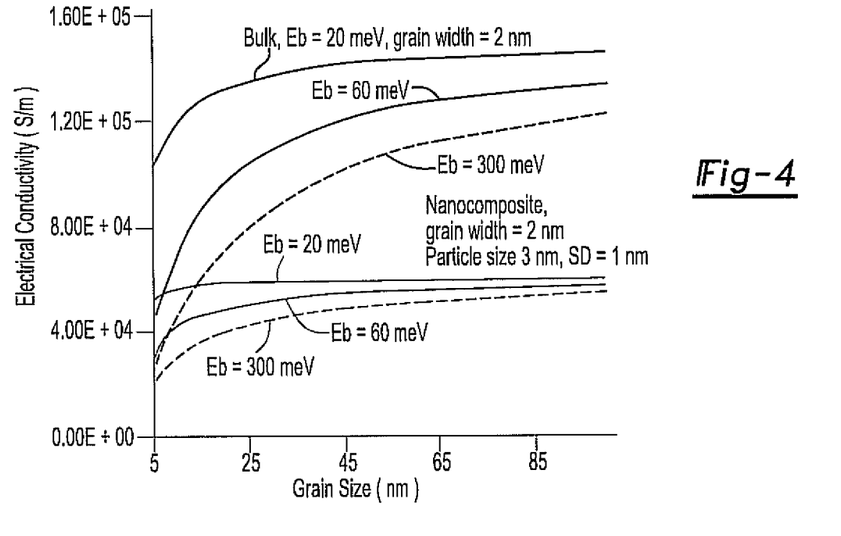
FIG. 4 is a graph illustrating effect of grain boundary properties on electrical conductivity.

In order to better understand the effect of grain related properties on the thermoelectric material behavior, and based on the model shown in FIG. 3, the effect of grain size on electrical conductivity was examined with results shown in FIG. 4. The width w of the grain boundaries was assumed to be constant at 2 nm while the grain boundary barrier height was varied from 20 meV to 300 meV. In addition, the electrical conductivity of a bulk thermoelectric material and a nanocomposite thermoelectric material was investigated and is shown in the graph. In the case of the nanocomposite thermoelectric material, $SiO_2$ nanoparticles of 3 nm diameter were used for the calculations. It is appreciated that FIG. 4 illustrates that with increasing grain size, the electrical conductivity increases, which can be explained due to decreasing probability of scattering events. In addition, with the inclusion of ceramic nanoparticles within the material, significantly lower electrical conductivities were observed. Finally, varying the grain boundary barrier height significantly affects the conductivities of both the bulk thermoelectric material and the nanocomposite thermoelectric material. It is appreciated that this effect is stronger at smaller grain sizes simply due to the fact that smaller grains increase the number of scattering events and thus reduce a carrier MFP.

Figure 5:
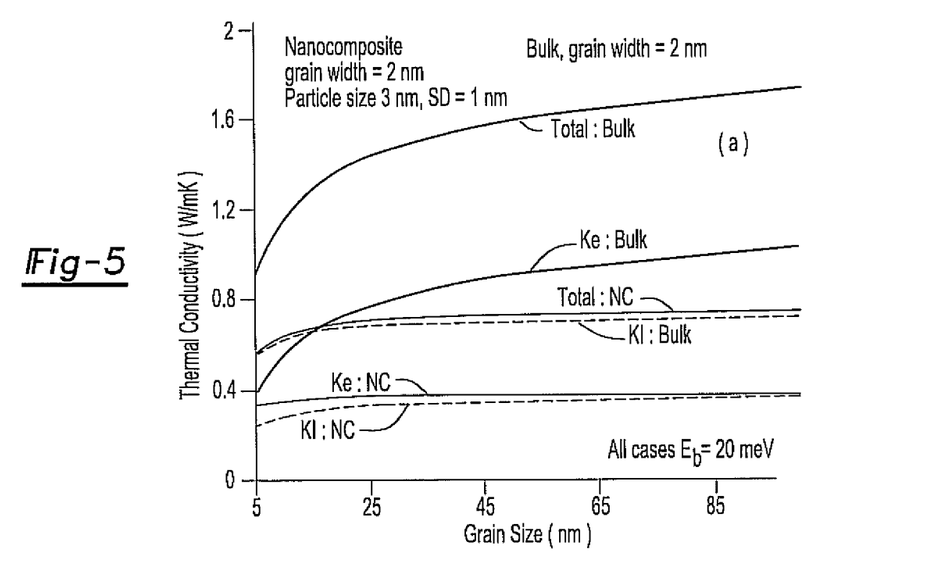
FIG. 5 is a graph illustrating effect of grain size on lattice (Kl) and electronic (Ke) thermal conductivity.
Figure 6:
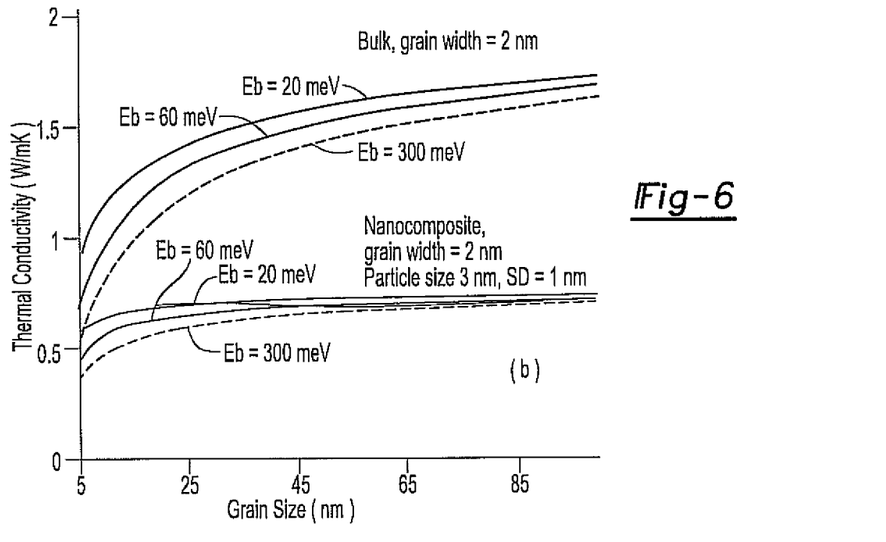
FIG. 6 is a graph illustrating effect of grain boundary properties on total thermal conductivity.

Turning now to FIG. 5, a graph illustrating the lattice and electronic thermal conductivity as a function of grain size is shown. Similar to FIG. 4, grain boundary scattering clearly affects both lattice and electronic thermal conductivity with the most significant effect occurring for grain sizes below 25 nm. In addition, FIG. 6 illustrates that total thermal conductivity illustrates a similar behavior to electrical conductivity which provides evidence that reduction in grain size for a thermoelectric material can be an effective way of reducing the material's thermal conductivity.

Figure 7:
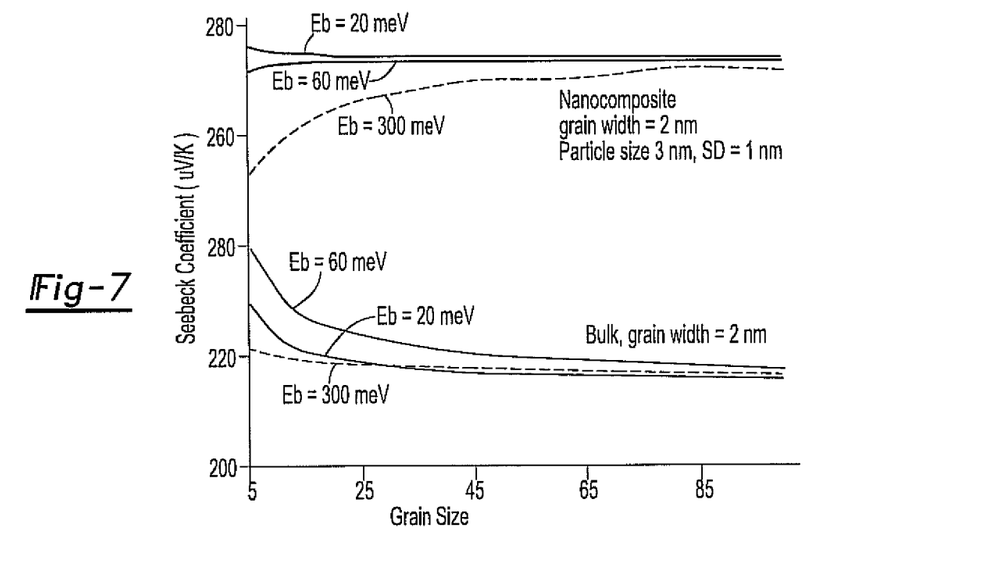
FIG. 7 is a graph illustrating effect of grain boundary properties on Seebeck coefficient.
Figure 8:
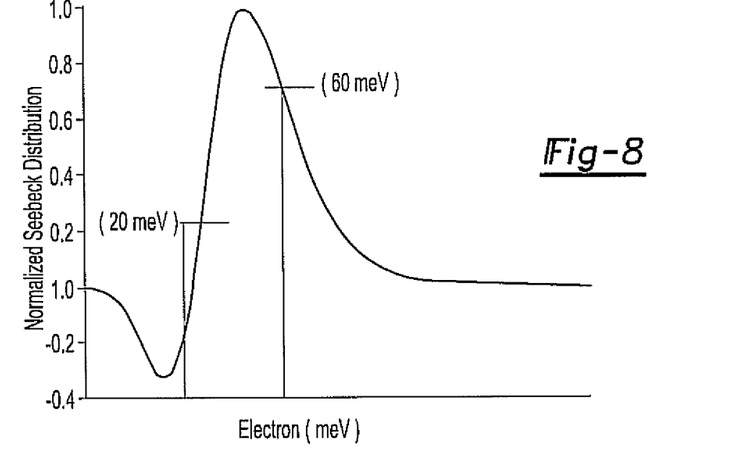
FIG. 8 is a graph illustrating calculated normalized Seebeck coefficient as a function of electron energy.

Regarding the Seebeck coefficient for a thermoelectric material, FIG. 7 illustrates a complicated relationship between the Seebeck coefficient, grain size, and grain boundary barrier height. In particular, and for bulk thermoelectric material, the highest Seebeck coefficient occurred for a grain boundary barrier height of 60 meV while for a nanocomposite thermoelectric material, the highest Seebeck coefficient was observed for a grain boundary barrier height of 20 meV. It is appreciated that the difference between the two materials and the associated Seebeck coefficient can be the result of filtering of low energy electrons within the grains of the nanocomposite thermoelectric material. In addition, FIG. 8 provides a typical normalized Seebeck coefficient distribution as a function of electron energy. As shown by this figure, a maximum value or maximum range of values for the Seebeck coefficient does not result from electron energies that are too low or too high. Stated differently, there is an intermediate value or range of values for electron energy that provides a desired Seebeck coefficient. In addition, low energy electrons pose a negative impact to the Seebeck coefficient.

Based on these figures and their teachings, it is clear that small grains with high grain boundary barrier potentials, for example $E_b$=300 meV, have the least effect on the Seebeck coefficient since such high potential barriers can filter even high energy electrons. On the other hand, FIG. 7 illustrates that the Seebeck coefficient behavior flipped or was inverted for the nanocomposite material versus the bulk material when the grain boundary barrier height was 20 meV and 60 meV, respectively. Not being bound by theory, this is postulated to be due to the Seebeck coefficient distribution being different for the two materials, and depending on the location of the peak of normalized Seebeck coefficient as shown in FIG. 8, either 20 meV or 60 meV can be more effective in increasing the Seebeck effect.

Figure 9:
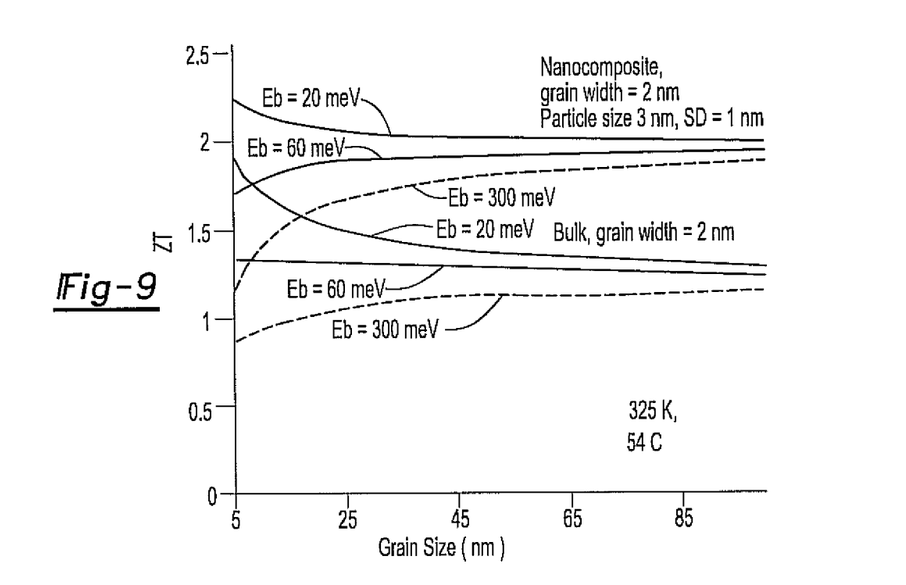
FIG. 9 is a graph illustrating effect of grain boundary properties on dimensionless figure of merit (ZT)

Regarding the dimensionless figure of merit ZT, FIG. 9 provides a comparison of ZT as a function of grain size, bulk thermoelectric material, nanocomposite thermoelectric material, and grain boundary barrier height. From this figure, it is appreciated that grain sizes below 25 nanometers can provide a dramatic improvement in the performance of bulk thermoelectric material and nanocomposite thermoelectric material. In addition, the grain boundary barrier height can significantly alter the ZT for a particular material. For example, at lower grain sizes, the ZT for the bulk and nanocomposite materials overlap, thereby suggesting that the benefit of adding second phase nanoparticles to a thermoelectric material can be diminished in cases where the grain boundary barrier potential is high due to impurities, doping, and the like.

Figure 10:
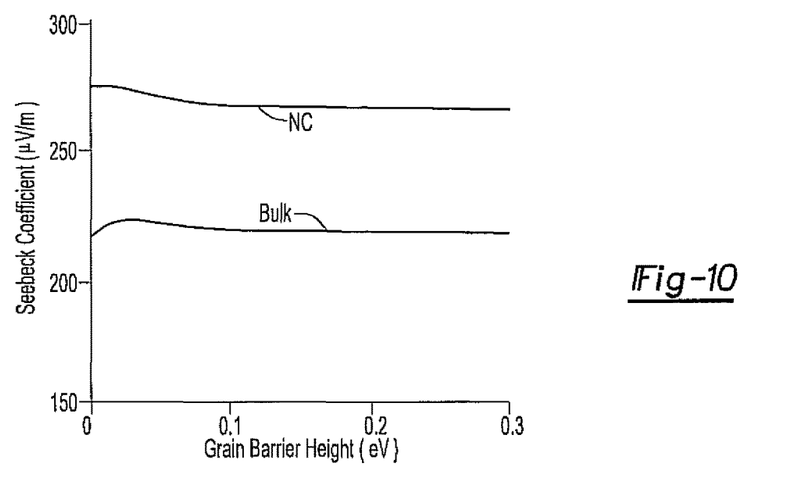
FIG. 10 is a graph illustrating Seebeck coefficient for a bulk (Bulk) and nanocomposite (NC) thermoelectric material as a function of grain boundary barrier height.
Figure 11:
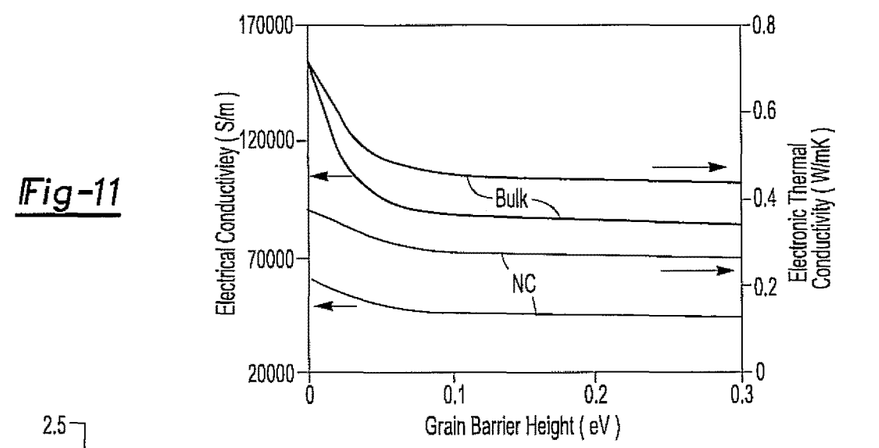
FIG. 11 is a graph illustrating electrical conductivity and electronic thermal conductivity for a bulk (Bulk) and nanocomposite (NC) thermoelectric material as a function of grain boundary barrier height.

The effect of ceramic nanoparticle inclusions within a bulk thermoelectric material on grain boundary barrier height can also be of interest with FIG. 10 illustrating a graphical representation of Seebeck coefficient as a function of grain boundary barrier height for a bulk thermoelectric material (Bulk) and a nanocomposite thermoelectric material (NC). As shown in FIG. 10, and for which a grain size of 30 nm was assumed, smaller grain boundary barrier heights are preferred with potentials over 100 meV virtually having no effect on the Seebeck coefficient of the material. In addition, FIG. 11 shows or illustrates the same behavior with respect to electrical conductivity and electronic thermal conductivity and FIG. 12 provides a graph illustrating the effect of grain boundary barrier height on ZT for bulk thermoelectric material and nanocomposite thermoelectric material.

Figure 12:
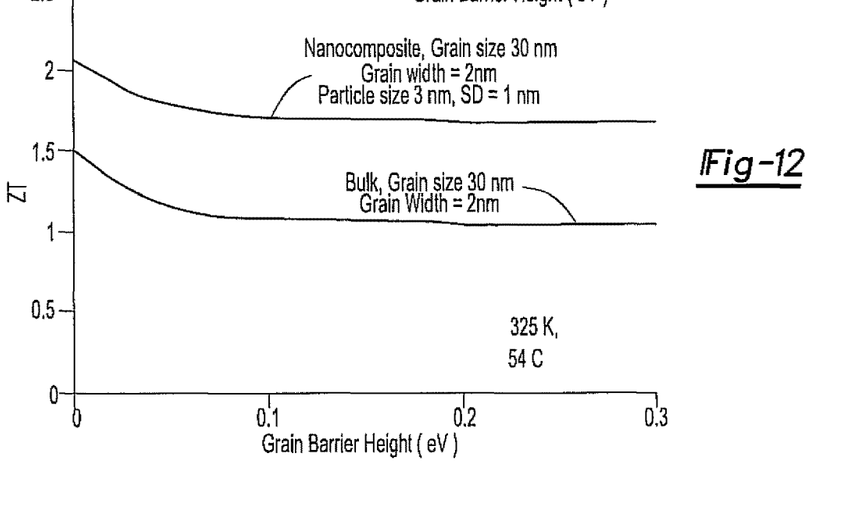
FIG. 12 is a graph illustrating ZT as a function of grain boundary barrier height.

It is appreciated that FIG. 12 could lead to the conclusion that lower grain boundary barrier heights are desired in all cases in order to achieve an increase in ZT for any thermoelectric material. However, such a conclusion can be false, for example when the grain size is also considered as discussed above in relation to FIG. 9.

It is appreciated that the process of calculating the thermal conductivity and electrical resistivity for a given nanocomposite material system as a function of material compositions affords for the calculation of figure of merit values as a function of the compositions. In this manner, researchers can estimate which matrix host-nanoparticle systems are more likely to exhibit relatively high ZT values and/or which compositions or range of compositions within a particular system may provide the highest ZT values. This range of compositions with the associated high ZT values can also be compared with other material properties such as mechanical property data, chemical property data and the like, in order to choose an optimum thermoelectric material composition for a given application. As such, the process provides a valuable tool to guide experimental design of thermoelectric materials.

As disclosed above, the plurality of material positions to be investigated can include a first component with a volume fraction of a second component ranging from 0.0 to 1.0. In some instances, the material compositions to be investigated can include the first component with a volume fraction of the second component ranging from 0.0 to 0.7. The plurality of thermal conductivity values are calculated as a function of the scattering cross section of the second component nanoparticles for the plurality of material compositions being investigated. In addition, the scattering cross section can be a function of the interfacial surface area of the second component nanoparticles for the plurality of material compositions being investigated. The function of the plurality of material compositions being investigated can include the size of the second component nanoparticles, the size distribution of the second component nanoparticles and an interfacial property of the second component nanoparticles. In some instances, an interfacial interaction property between the second component nanoparticles and the first component can be used.

It is appreciated that the thermoelectric device can be designed and developed using the process disclosed herein, the thermoelectric device having a first electrical contact, a second electrical contact, and a thermoelectric bulk material located within an electrical path between the first electrical contact and the second electrical contact. The thermoelectric bulk material can include a first powdered component having a particulate form, the first powdered component being electrically conducting, and a second powdered component having a particulate form, the second powdered component having an electrical conductivity substantially less than the first powdered component. The first and second powdered components can retain the particulate form in the bulk thermoelectric material and the thermoelectric bulk material can be a composite that has nanostructures of the first powdered component. The first component can be a metal or a semiconductor. The second component can be an electrical insulator in the form of a ceramic. It is appreciated that the process can also be used for semiconductor-metal and semiconductor-semiconductor thermoelectric material systems.

It is further appreciated that the bulk thermoelectric material can be an electrically conducting material such as a semiconductor or metal. In addition, the electrically conducting material can be an organic material, or an organic material such as an organic semiconductor.

In the temperature range between 300K to 500K, an n-type material such as Bi2Te$_3$ or Bi$_2$Se$_3$ and/or the p-type material such as Bi$_2$Te$_3$ or Sb$_2$Te$_3$ can be used for the bulk thermoelectric material. For the temperature range between 500K to 700K, n-type materials such as PbTe or SnTe doped with Bi and/or p-type materials such as PbTe or SnTe can be used. In addition, materials such as ZnSb, SiGe, CoSb, CeFeCoSb, and alloys thereof can be used for the bulk thermoelectric material. Regarding nanocomposite thermoelectric materials, nanoparticles of insulating materials such as $SiO_2$, ZnO, $Al_2O_3$, $LaCoO_4$, $NaCoO_4$, $SnO_2$, $(ZnO)_x(In_2O_5)_y$, ZrO, Y-stabilized ZrO, $ZrO_2$, yttria stabilized $ZrO_2$ (YSZ), $La_2O_3$ stabilized YSZ, other oxide materials, carbon nanoparticles, electrically insulating polymer nanoparticles, fullerenes such as $C_{60}$.

The invention is not restricted to the illustrative examples described above. The examples are not intended as limitations on the scope of the invention. Methods, apparatus, compositions and the like described herein are exemplary and not intended as limitations on the scope of the invention. Changes therein and other uses will occur to those skilled in the art. The scope of the invention is defined by the scope of the claims.

We claim:

1. A process for manufacturing a thermoelectric material having a plurality of grains and grain boundaries, the process comprising:

determining a material composition to be investigated for the thermoelectric material;

providing a range of values of matrix grain size between 5 and 100 nanometers (nm) and a range of values of matrix grain boundary barrier height between 10 and 300 milli-electron volts (meV);

calculating a plurality of Seebeck coefficients, electrical resistivity values and thermal conductivity values for the material composition as a function of the range of values of matrix grain size between 5 and 100 nm and the range of values of grain boundary barrier height between 10 and 300 meV;

calculating a range of figure of merit values for the material composition as a function of the calculated Seebeck coefficients, calculated electrical resistivity values and calculated thermal conductivity values, the calculated range of figure of merit values being a function of the range of values of matrix grain size between 5 and 100 nm and the range of values of matrix grain boundary barrier height between 10 and 300 meV;

selecting a figure of merit value from the calculated range of figure of merit values, the selected figure of merit value corresponding to a value of matrix grain size between 5 and 100 nm and a value of matrix grain boundary barrier height between 10 and 300 meV;

providing powders having the investigated material composition, the powders having a mean diameter less than or generally equal to the value of matrix grain size that corresponds to the selected figure of merit value; and consolidating the powders and manufacturing a thermoelectric material having the investigated material composition, a matrix grain size generally equal to the value of matrix grain size that corresponds to the selected figure of merit and a matrix grain boundary barrier height generally equal to the value of matrix grain boundary barrier height that corresponds to the selected figure of merit.

2. The process of claim 1, wherein the material composition is a matrix thermoelectric material composition.

3. The process of claim 1, wherein the material composition is a nanocomposite thermoelectric material composition.

4. The process of claim 1, wherein the matrix grain size of the manufactured thermoelectric material is obtained by consolidating a plurality of nanoparticles having a mean diameter generally equal to the matrix grain size.

5. The process of claim 1, wherein the grain boundary barrier height of the manufactured thermoelectric material is obtained by doping of the thermoelectric material.

6. The process of claim 1, wherein the grain boundary barrier height of the manufactured thermoelectric material is obtained by altering a surface of a plurality of nanoparticles used to manufacture the thermoelectric material.

7. The process of claim 6, wherein altering the surface of the plurality of nanoparticles includes applying a coating on the surface of the plurality of nanoparticles.

* * * * *

UNITED STATES PATENT AND TRADEMARK OFFICE
CERTIFICATE OF CORRECTION

PATENT NO. : 10,811,160 B2
APPLICATION NO. : 13/117286
DATED : October 20, 2020
INVENTOR(S) : Banerjee et al.

It is certified that error appears in the above-identified patent and that said Letters Patent is hereby corrected as shown below:

In the Specification

In Column 1, Line(s) 11, delete "theimoelectric" and insert --thermoelectric--, therefor.

In Column 2, Line(s) 23, delete "thennal" and insert --thermal--, therefor.

In Column 2, Line(s) 43, delete "thermolectric" and insert --thermoelectric--, therefor.

Signed and Sealed this
Twenty-ninth Day of December, 2020

Andrei Iancu
*Director of the United States Patent and Trademark Office*